US 6,538,288 B2

(12) United States Patent
Lee et al.

(10) Patent No.: US 6,538,288 B2
(45) Date of Patent: Mar. 25, 2003

(54) ESD PROTECTION DEVICE WITH ISLAND-LIKE DISTRIBUTED P+ DIFFUSION REGIONS

(75) Inventors: Shu-Chuan Lee, Hsinchu (TW); Yu-Chen Lin, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/725,220

(22) Filed: Nov. 29, 2000

(65) Prior Publication Data

US 2002/0063313 A1 May 30, 2002

(51) Int. Cl.[7] .............................................. H01L 23/62
(52) U.S. Cl. ...................... 257/355; 257/349; 257/350; 257/351; 257/357; 257/360
(58) Field of Search ................................ 257/349, 350, 257/351, 357, 360, 355; 361/111, 56, 212, 117, 119

(56) References Cited

U.S. PATENT DOCUMENTS

| 4,989,057 | A | * | 1/1991 | Lu ............................. 357/23.7 |
| 5,486,716 | A | * | 1/1996 | Saito et al. .................. 257/360 |
| 5,923,067 | A | * | 7/1999 | Voldman ..................... 257/349 |
| 6,034,397 | A | * | 3/2000 | Voldman ..................... 257/355 |

* cited by examiner

*Primary Examiner*—Michael S. Lebentritt
*Assistant Examiner*—Doug Menz
(74) *Attorney, Agent, or Firm*—Arent Fox Kintner Plotkin & Kahn, PLLC

(57) ABSTRACT

An electrostatic discharge (ESD) protection structure for an integrated circuit constructed on a substrate of a first type is provided to includes a plurality of island-like distributed diffusion regions. The protection structure includes a semiconductor controlled rectifier (SCR), an MOS transistor and a plurality of island-like distributed diffusion regions of the first type. The semiconductor controlled rectifier is constructed on the base region and coupled to the integrated circuit. The SCR includes a first region of a second type formed next to the base region, a second region of the first type formed in the first region, and a third region of the second type formed in the base region. The MOS transistor has a drain coupled to the bonding pad or a VDD bus, and a gate and a source both coupled to a reference ground. The plurality of island-like distributed diffusion regions of the first type are formed in the base region and each is coupled to the reference ground.

8 Claims, 2 Drawing Sheets

ESD PROTECTION DEVICE WITH ISLAND-LIKE DISTRIBUTED P+ DIFFUSION REGIONS

FIELD OF INVENTION

The invention relates to an ESD protection device employing the SCR.

BACKGROUND OF THE INVENTION

In a Human-Body-Model ESD transient, an 100PF capacitor is first charged up to an ESD zapping voltage, and then discharges through a 1.5 Kohms resistor onto an IC pin. For instance, a zapping voltage level of 2 KV is used to qualify an IC package. The initial peak current is roughly 1.2 A with a rise time of approximately 10 nsec. For integrated circuit packages, the VDD-to-VSS capacitance is typically larger than 1 nF. If the ESD energy is directly absorbed by the power bus, i.e. for ESD stress of VDD pin to VSS pin, or indirectly absorbed by the power bus, i.e. the positive ESD stress on an input or I/O pin that has a pull up device, then the voltage-rising rate inside an IC may reach 1 to 2 volt per nano-second for a Human-Body-Model ESD zapping at 2 to 3 KV level. The pull up device includes p+/nwell diode or PMOSFET.

Transistors, such as grounded-gate NMOS(GGNMOS), field-oxide MOSFET, output buffer transistors, or bipolar transistors, have been commonly used as primary ESD protection elements for integrated circuits. A Semiconductor Controlled Rectifier (SCR), typically including pnpn junctions, can also be used as primary ESD protection device for protecting an IC pin or a power bus during an ESD event. "ESD in Silicon Integrated Circuits" by A. Amerasekera and C. Duvvury, Chap. 3 and 4, John Wiley & Sons, 1995, provides a basic introduction for an SCR used as an ESD protection device.

The conventional SCR is triggered by the nwell to p-substrate junction breakdown, which is relatively high, for instance, typically >20V. This is a drawback when an SCR is used as an ESD protection element since it may not trigger sooner enough during an ESD event to protect other circuit elements from ESD damages.

U.S. Pat. No. 5,465,189 describes an SCR used to provide on-chip protection against ESD stress applied at the input, output, power-supply bus, or between any arbitrary pair of pins of an integrated circuit. A novel structure in the patent having a low breakdown voltage is incorporated into the SCR to lower the trigger voltage of the SCR. FIG. 1 shows the low-voltage trigger SCR, according to U.S. Pat. No. 5,465,189, which integrates an NMOSFET with the SCR, such that the trigger voltage of the SCR is equal to the trigger voltage of an NMOSFET, which is typically roughly at or lower than 12 volts. As a positive ESD current is applied to the pad or VDD bus, the electrons in the P-substrate 10 flow from n3+ region 20 to n2+ region 18. Due to impact ionization, the corresponding holes generated flow into the n3+ region 20 and then into the Cathode(GND). The generated holes in the P-substrate 10 renders a voltage drop between substrate and n3+ region 20 and therefore a forward-biased condition between P-substrate 10 and n3+ region 20. This condition allows an easier triggering of the SCR formed by the p1+/Nwell/P-substrate/n3+. Although the SCR turns on easily with this approach, however, it is possible that, under normal circuit operation without any ESD event, minor substrate current may turn on the SCR unexpectedly. This is the drawback with the approach of FIG. 1.

FIG. 2 shows a variation of FIG. 1 in which a P2+ region 22 is provided and connected to the Cathode(GND) to overcome the drawback of that in FIG. 1. As a positive ESD current is applied to the pad or VDD bus, the electrons in the substrate flow from n3+ region 20 to n2+ region 18. Due to impact ionization, the corresponding holes generated flow into n3+ region 20 and the P2+ region 22, and then into the Cathode(GND). The generated holes in the P-substrate 10 renders a voltage drop between P-substrate 10 and n3+ region 20 and therefore a forward-biased condition between P-substrate 10 and n3+ region 20. This condition allows an easier triggering of the SCR formed by the p1+/Nwell/P-substrate/n3+. It is noted, due to the existence of the P2+ region 22, some amount of generated holes are absorbed into the GND. Although this approach solve the drawback of that shown in FIG. 1, however, the current Itr for triggering the SCR is still a little bit higher than expected.

To overcome the drawbacks mentioned above, the present invention provides an improvement ESD structure.

SUMMARY OF INVENTION

An electrostatic discharge (ESD) protection structure for an integrated circuit constructed on a substrate of a first type is provided.

The protection structure includes a semiconductor controlled rectifier, an MOS transistor and a plurality of island-like distributed diffusion regions of the first type.

The semiconductor controlled rectifier (SCR) is constructed on the base region and coupled to the integrated circuit. The SCR includes a first region of a second type formed next to said base region, a second region of the first type formed in the first region, and a third region of the second type formed in the base region.

The MOS transistor has a drain coupled to the bonding pad and a gate and a source both coupled to a reference ground.

The plurality of island-like distributed diffusion regions of the first type are formed in the base region and each is coupled to the reference ground.

BRIEF DESCRIPTION OF THE APPENDED DRAWINGS

DESCRIPTION OF THE PREFERRED EMBODIMENTS

Figure 3:
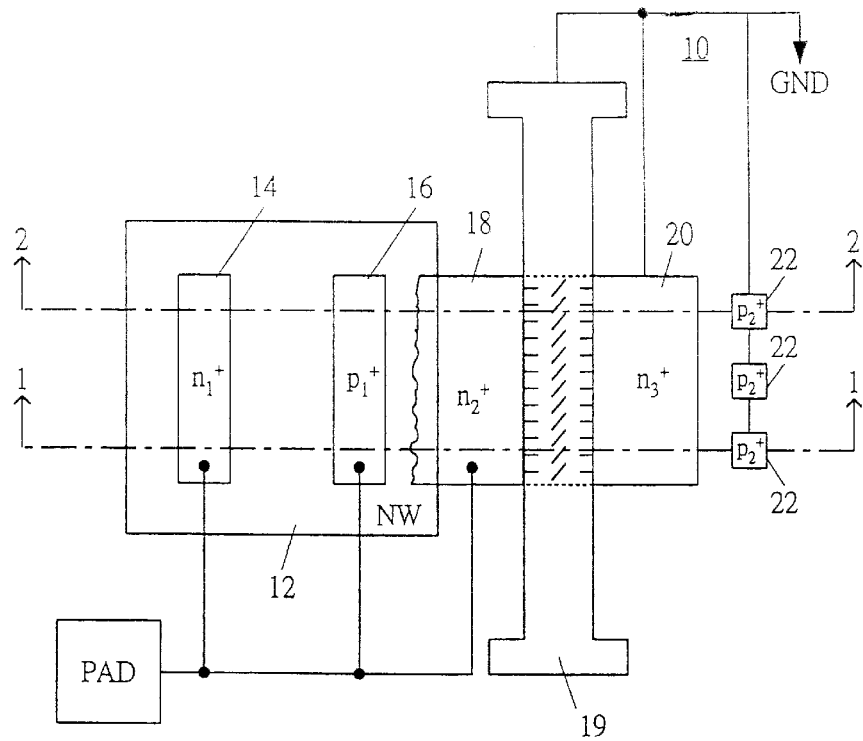
FIG. 3 shows the top view of an embodiment of the invention.

Referring to FIG. 3, the invention has an SCR constructed on a base region 10 of a first type and coupled to the integrated circuit (not shown). The SCR includes a first region 12 of a second type formed next to the base region 10, a second region 16 of the first type formed in the first region 12, and a third region 20 of the second type formed in the base region 10. In a preferred embodiment, the first type is P type and the second type is N type. In other words, the SCR is formed by regions of represented by 16(p1+)/12 (Nwell)/10(P-substrate)/20(n3+).

The protection structure further includes a MOS transistor having a drain 18 coupled to the bonding pad or VDD bus, and a gate 19 and a source both coupled to a reference ground (GND). The source of the NMOS is defined by the third region 20.

The protection structure further includes a plurality of island-like distributed diffusion regions 22 of the first type formed in the base region 10. Each island-like distributed diffusion regions 22 is coupled to the reference ground GND. The first region 12 of nwell in FIG. 3 is coupled to the pad or VDD bus via the n1+ region 14.

Figure 1:
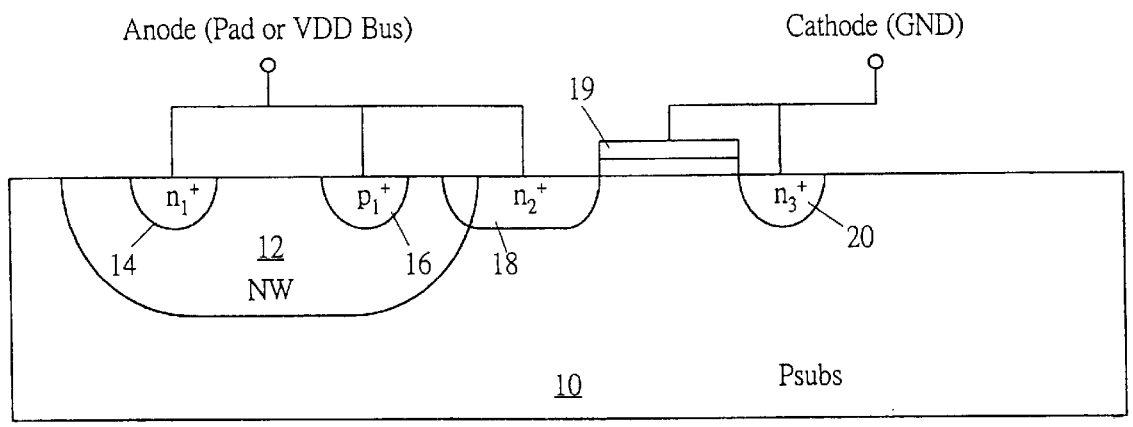
FIG. 1 shows a conventional SCR structure.

The cross sectional view of the protection structure in FIG. 3 along the sectional line 1—1 is same as that shown in FIG. 1. The cross sectional view of the protection structure in FIG. 3 along the sectional line 2—2 is same as that shown in FIG. 2.

As shown, the second region 16 is coupled to a first bus electrically coupled to the pad or VDD bus which connected to an ESD transient voltage source.

In a preferred embodiment, the third region 20 is coupled to a second bus which is connected to the GND.

In a preferred embodiment, the first region 12 is an nwell, the second region 16 is a p+ diffusion in the nwell 12, the third region 20 is an n+ diffusion in the base region 10, and the base region 10 is of p type.

In another embodiment, the first region 12 is a pwell, the second region 16 is an n+ diffusion in the pwell 12, the third region 20 is a p+ diffusion in the base region 10, and the base region 10 is of n type.

In another embodiment, the first region 12 is a first well of the second type, and the base region 10 is a substrate.

In another embodiment, the first region 12 is a first well of the second type, the base region 10 is a second well of the first type, and the first well is within the second well. In an embodiment, the second well is constructed on a substrate of the integrated circuit. In alternative embodiment, the substrate is of the second type.

In a preferred embodiment, the base region 10 is the substrate of the integrated circuit.

In a preferred embodiment, the first region 12 is formed within the base region 10.

Figure 2:
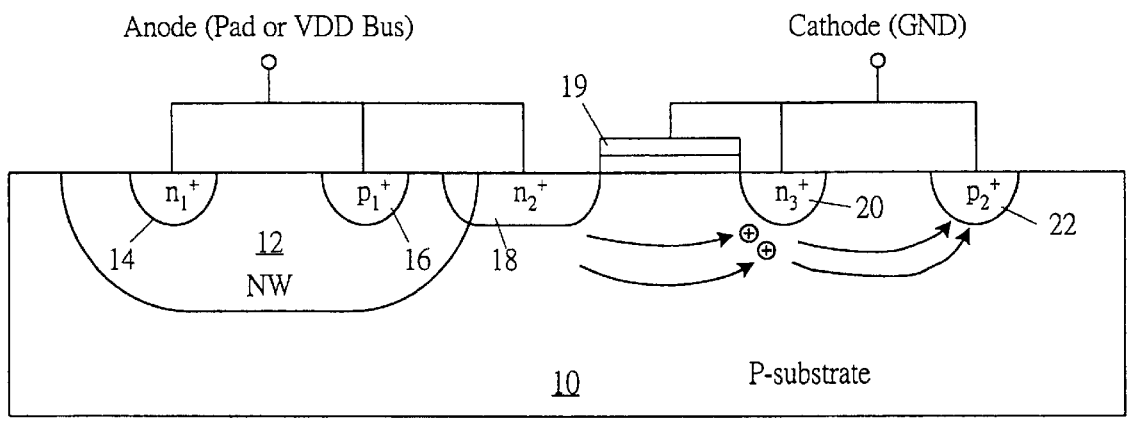
FIG. 2 shows another conventional SCR.

It is clear that the invention shown in FIG. 3 preserves benefits of the approaches shown in the FIGS. 1 and 2 of the conventional approach while dispensing with the drawbacks inherent with those shown in the FIGS. 1 and 2.

Figure 4:
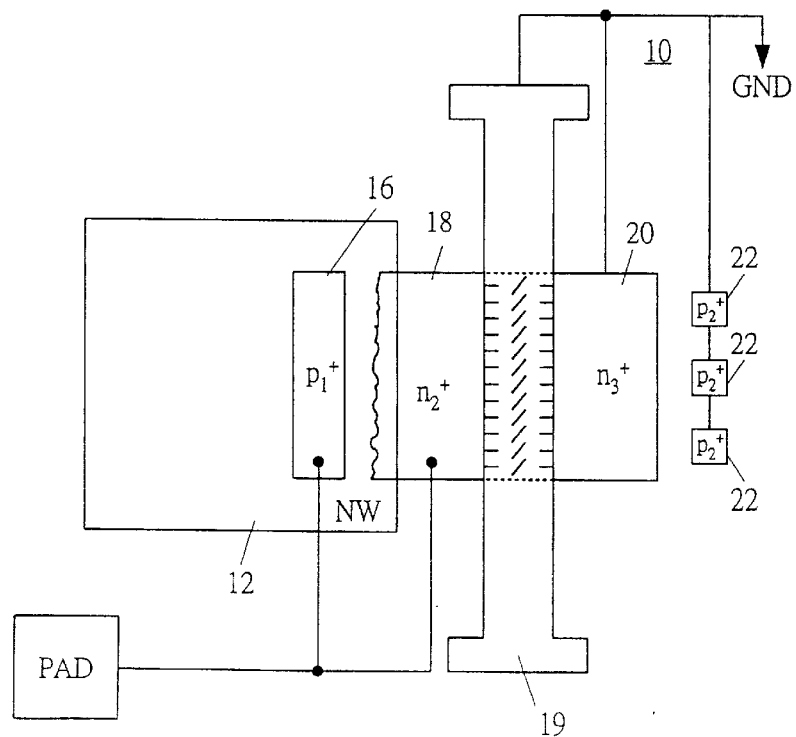
FIG. 4 shows the top view a second embodiment of the invention.

The invention also applicable to a floating well structure shown in FIG. 4 of the second embodiment of the invention. In FIGS. 3 and 4, element of like numeral represents same structure and performs the same function. Different from FIG. 3, the first region 12 of nwell in FIG. 4 is left floating.

It is also clear that the invention shown in FIG. 4 preserves benefits of the approaches shown in the FIGS. 1 and 2 of the conventional approach while dispensing with the drawbacks inherent with those shown in the FIGS. 1 and 2.

What is claimed is:

1. An electrostatic discharge (ESD) protection structure for an integrated circuit constructed on a base region of a first type, the integrated circuit having a bonding pad, comprising:

a semiconductor controlled rectifier (SCR) constructed on the base region and coupled to said integrated circuit, said SCR including a first region of a second type formed next to said base region, a second region of the first type formed in the first region, and a third region of the second type formed in the base region;

a MOS transistor having a drain coupled to the bonding pad and a gate and a source both coupled to a reference ground, said source being defined by said third region;

a plurality of island-like distributed diffusion regions of the first type formed in said base region of the first type each conductively coupled to the reference ground, wherein said plurality of island-like distributed diffusion regions are disposed along a side of the source of said MOS transistor.

2. The structure of claim 1, wherein the base region is a substrate of the integrated circuit.

3. The structure of claim 1, wherein the first region is an nwell, the second region is a p+ diffusion, the third region is an n+ diffusion, the base region is of p-type.

4. The structure of claim 1, wherein the first region is formed within the base region.

5. An electrostatic discharge (ESD) protection structure for an integrated circuit constructed on a base region of a first type, the integrated circuit having a VDD bus, comprising:

a semiconductor controlled rectifier (SCR) constructed on the base region and coupled to said integrated circuit, said SCR including a first region of a second type formed next to said base region, a second region of the first type formed in the first region, and a third region of the second type formed in the base region;

a MOS transistor having a drain coupled to the VDD bus and a gate and a source both coupled to a reference ground, said source being defined by said third region;

a plurality of island-like distributed diffusion regions of the first type formed in said base region of the first type each conductively coupled to the reference ground, wherein said plurality of island-like distributed diffusion regions are disposed along a side of the source of said MOS transistor.

6. The structure of claim 5, wherein the base region is a substrate of the integrated circuit.

7. The structure of claim 5, wherein the first region is an nwell, the second region is a p+ diffusion, the third region is an n+ diffusion, the base region is of p-type.

8. The structure of claim 5, wherein the first region is formed within the base region.

* * * * *